United States Patent [19]
Furukawa

[11] Patent Number: 6,105,245
[45] Date of Patent: Aug. 22, 2000

[54] METHOD OF MANUFACTURING A RESIN-ENCAPSULATED SEMICONDUCTOR PACKAGE

[75] Inventor: Yuichiro Furukawa, Tateyama, Japan

[73] Assignee: Nippon Steel Semiconductor Corporation, Tateyama, Japan

[21] Appl. No.: 09/024,562

[22] Filed: Feb. 17, 1998

[30] Foreign Application Priority Data

Feb. 17, 1997 [JP] Japan .................................. 9-046919

[51] Int. Cl.[7] .................................................. H01R 9/00
[52] U.S. Cl. ............................................. 29/843; 29/855
[58] Field of Search ........................... 29/842, 843, 854, 29/855

[56] References Cited

U.S. PATENT DOCUMENTS

| | | | |
|---|---|---|---|
| 4,974,052 | 11/1990 | Ichiyama | 357/67 |
| 5,890,283 | 4/1999 | Sakemi et al. | 29/840 |
| 5,933,752 | 8/1999 | Yanagida | 438/613 |

FOREIGN PATENT DOCUMENTS 8-279575  10/1996  Japan .

*Primary Examiner*—S. Thomas Hughes
*Assistant Examiner*—Kevin G. Vereene
*Attorney, Agent, or Firm*—Pollock, Vande Sande & Amernick

[57] ABSTRACT

In a method of manufacturing a resin-encapsulated semiconductor package, a protective film is formed on the surface of a semiconductor chip on which chip electrodes are formed, and openings are formed in the protective film to expose at least part of each chip electrode. Subsequently, conductive balls serving as external connecting terminals are fitted in these openings and connected to the chip electrodes, and all surfaces of the semiconductor chip and the conductive balls are encapsulated with a resin. Finally, the surface of the resin formed on the conductive balls is polished to partially expose the conductive balls. Since a mold need not have pins run against the chip electrode for forming external connecting terminals, damage to the chip electrodes and an increase in cost of the mold can be prevented, and the package can be manufactured inexpensively without deteriorating the reliability.

8 Claims, 6 Drawing Sheets

METHOD OF MANUFACTURING A RESIN-ENCAPSULATED SEMICONDUCTOR PACKAGE

BACKGROUND OF THE INVENTION

1. Field of the Invention

The present invention relates to a method of manufacturing a semiconductor package and, more particularly, to a technique suitably applicable to the manufacturing of a resin-encapsulated semiconductor package formed by encapsulating a semiconductor chip with a resin.

2. Description of the Related Art

Demands on information and communication apparatuses are increasing yearly in the recent information age. Of these information and communication apparatuses, portable information apparatuses particularly increasingly demanded, such as a camcorder, a PHS (Personal Handyphone System), and a notebook personal computer, tend to be entirely made smaller and thinner to improve the portability. Accordingly, LSI packages incorporated into these apparatuses are naturally required to be made smaller and thinner.

Meanwhile, as the large scale integration of semiconductor elements advances, the chip area of a semiconductor gradually increases. Consequently, it becomes difficult to accommodate semiconductor elements in a package with required dimensions by a packaging method by which a chip is die-bonded to the die pad of a lead frame.

To eliminate this difficulty, a package structure as described in Japanese Patent Laid-Open No. 8-279575 has been proposed. FIG. 4 is a schematic sectional view showing this conventional package. In this package, conductive terminals are formed to vertically extend from electrodes on a semiconductor chip toward the surface of the semiconductor package and soldered to a pattern on a printed board.

In the semiconductor package shown in FIG. 4, a semiconductor chip 11 is encapsulated with an encapsulating resin 12. A plurality of chip electrodes 13 are formed on one surface (upper surface) of the semiconductor chip 11, and a thin flat die pad 22 is bonded to the other surface (lower surface) of the semiconductor chip 11 by a die-bonding material 18.

A protective film 21 having openings is formed on the surface, on which the chip electrodes 13 are formed, of the semiconductor chip 11, and in each of the openings at least part of the upper surface of the chip electrode 13 is exposed. Connecting holes 16 are formed in the encapsulating resin 12 in the direction of package thickness to communicate with the chip electrodes 13. The connecting holes 16 are filled with a conductive material, and this conductive material constitutes external connecting terminals 17.

A method of manufacturing the above semiconductor package will be described below with reference to FIGS. 5A to 5H.

First, as shown in FIG. 5A, chip electrodes 13 are formed on the upper surface of a semiconductor chip 11 on which circuits are formed.

Subsequently, as shown in FIG. 5B, a protective film 21 is formed on the surface, on which the chip electrodes 13 are formed, of the semiconductor chip 11 to prevent α-rays from entering the semiconductor chip 11 from the outside.

In FIG. 5C, a resist 25 is applied to the surface of the protective film 21 and patterned by normal photolithography.

In FIG. 5D, the protective film 21 over the chip electrodes 13 is removed by anisotropic etching to form openings in each of which at least part of the upper surface of the chip electrode 13 is exposed.

In FIG. 5E, a surface, on which the chip electrodes 13 are not formed, of the semiconductor chip 11 is fixed to one surface of a die pad 22 with a die-bonding material 18 serving as a buffer material interposed therebetween.

In FIG. 5F, the semiconductor chip 11 is located in the cavity of a mold 23, so that pins 24 projecting from the cavity surface of the mold 23 are run against the upper surfaces of the chip electrodes 13 exposed in the openings of the protective film 21.

In this state, a resin is injected to fill the cavity of the mold 23. Consequently, as shown in FIG. 5G, the semiconductor chip 11 is encapsulated with an encapsulating resin 12, and connecting holes 16 are formed in the encapsulating resin 12 to communicate with the chip electrodes 13 of the semiconductor chip 11.

Finally, as shown in FIG. 5H, the connecting holes 16 are filled with a conductive material to form external connecting terminals 17, thereby obtaining a semiconductor package.

In the conventional semiconductor package as described above, however, a mold must have portions for forming connecting holes. It is inevitable in the future to further miniaturize packages and increase the number of external connecting terminals such as encountered in logic products for specific applications. Therefore, when semiconductor packages are manufactured by the conventional technique, precise processing is required in the manufacture of a mold. This increases the cost of the mold.

Additionally, a mold is brought into contact with the surfaces of chip electrodes when connecting holes are formed, and this can damage the chip electrodes. To prevent the damage, it is necessary to form a buffer portion between a semiconductor chip and a die pad. Therefore, the number of manufacturing steps is increased.

Furthermore, the step of filling a package with external connecting terminals is necessary after molding and, if these terminals are formed as separate parts, the number of parts is increased. Therefore, the workability is lowered.

SUMMARY OF THE INVENTION

It is an object of the present invention to provide a method of manufacturing a semiconductor package formed by burying connecting terminals extending from electrodes of a semiconductor chip toward the surface of the semiconductor package in the semiconductor package, in which a mold and the semiconductor chip are prevented from contacting each other during resin molding.

It is another object of the present invention to provide a method of manufacturing a semiconductor package formed by burying connecting terminals extending from electrodes of a semiconductor chip toward the surface of the semiconductor package in the semiconductor package, in which damage to the semiconductor chip during resin molding is prevented.

It is still another object of the present invention to provide a method of manufacturing a semiconductor package formed by burying connecting terminals extending from electrodes of a semiconductor chip toward the surface of the semiconductor package in the semiconductor package, in which the shape of a mold used in resin molding is simplified.

According to an aspect of the present invention, there is provided a method of manufacturing a resin-encapsulated semiconductor package formed by encapsulating a semiconductor chip with a resin comprising the steps of forming a protective film on a surface of the semiconductor chip on which a chip electrode is formed, forming an opening in the protective film to expose at least part of the chip electrode, fitting a conductive ball in the opening and connecting the conductive ball to the chip electrode, encapsulating the semiconductor chip and the conductive ball by covering all surfaces thereof with the resin, and polishing a surface of the resin formed on the conductive ball to partially expose the conductive ball from the surface of the resin.

Accordingly, no pins for forming external terminal connecting holes need be formed in a mold, so the mold can be manufactured inexpensively. Also, it is unnecessary to bring pins for forming external terminal connecting holes into contact with the chip electrodes when the semiconductor chip is resin-encapsulated, so damage to the chip electrodes can be prevented.

Preferably, the conductive ball is made of a material having a melting temperature higher than the melding temperature of solder used when the semiconductor package is connected to a printed board.

Preferably, the conductive ball is selected from the group consisting of a gold ball, an aluminum ball, and a solder ball.

According to another aspect of the present invention, there is provided a method of manufacturing a resin-encapsulated semiconductor package formed by encapsulating a semiconductor chip with a resin comprising the steps of forming a protective film on a surface of the semiconductor chip on which a chip electrode is formed, forming an opening in the protective film to expose at least part of the chip electrode, fitting a conductive member in the opening and connecting the conductive member to the chip electrode, encapsulating the semiconductor chip and the conductive member by covering all surfaces thereof with the resin, and polishing a surface of the resin formed on the conductive member to partially expose the conductive member from the surface of the resin.

In the present invention, the conductive balls serving as external connecting terminals are formed in advance on the chip electrodes before the semiconductor chip is resin-encapsulated. That is, no connecting holes need be formed in the package by a mold or the like. Since no portions for forming connecting holes need be formed in a mold, precise processing is not required in the manufacture of a mold for even a small package or a package having a large number of external connecting terminals. Consequently, an increase in cost of the mold can be prevented.

Additionally, since it is unnecessary to bring a mold into contact with the chip electrodes to form connecting holes, damage to the chip electrodes can be prevented.

Furthermore, since no buffer portion for preventing damage to the semiconductor chip need be formed, a thin package can be realized.

DETAILED DESCRIPTION OF THE PREFERRED EMBODIMENT

An embodiment of a method of manufacturing a resin-encapsulated semiconductor package according to the present invention will be described in detail below with reference to the accompanying drawings.

Figure 1:
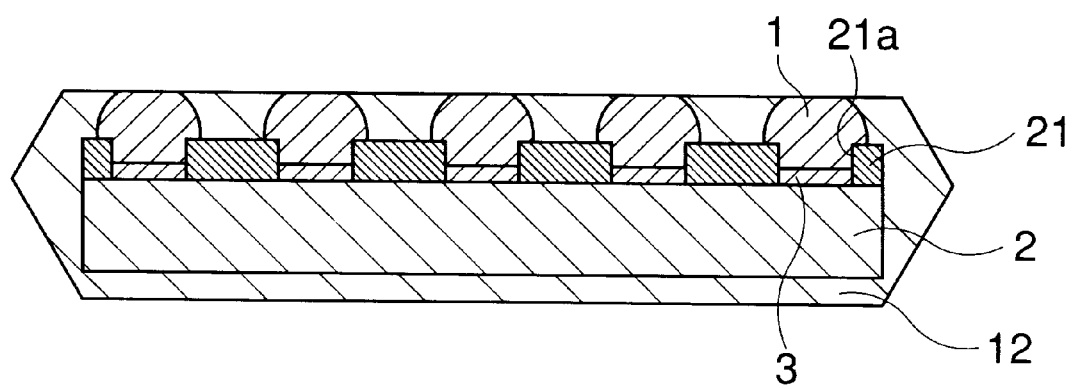
FIG. 1 is a schematic sectional view showing a semiconductor package of the present invention.

First, the schematic arrangement of this semiconductor device will be described. FIG. 1 is a sectional view showing a semiconductor package according to an embodiment of the present invention. FIGS. 2A to 2H are sectional views showing the semiconductor package shown in FIG. 1 in steps of manufacturing it in order of steps. FIG. 3 is a sectional view showing a jig in a step of manufacturing the semiconductor package.

In the semiconductor package of the embodiment shown in FIG. 1, a semiconductor chip 2 is encapsulated with an encapsulating resin 12. A plurality of chip electrodes 3 are formed on one surface (upper surface) of the semiconductor chip 2. A protective film 21 having openings 21a is formed on the surface, on which the chip electrodes 3 are formed, of the semiconductor chip 2, and in each of the openings 21a at least part of the upper surface of the chip electrode 3 is exposed. An external connecting terminal 1 made of a solder ball is formed on the upper surface of each chip electrode 3. The semiconductor chip 2 is completely covered with the encapsulating resin 12. The external connecting terminals 1 are partially exposed to the surface of the encapsulating resin 12.

A method of manufacturing the semiconductor package according to this embodiment will be described below with reference to FIGS. 2A to 2H, and 3.

Figure 2A:
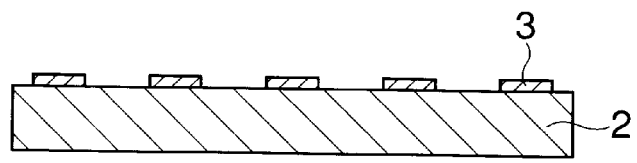
FIGS. 2A to 2H are schematic sectional views for explaining steps in manufacturing the semiconductor package shown in FIG. 1.
Figure 3:
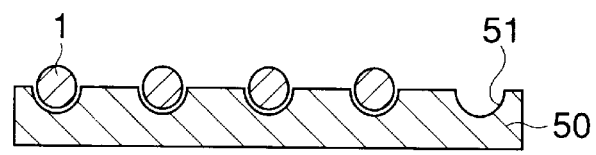
FIG. 3 is a schematic sectional view for explaining a step in manufacturing the semiconductor package.
Figure 4:
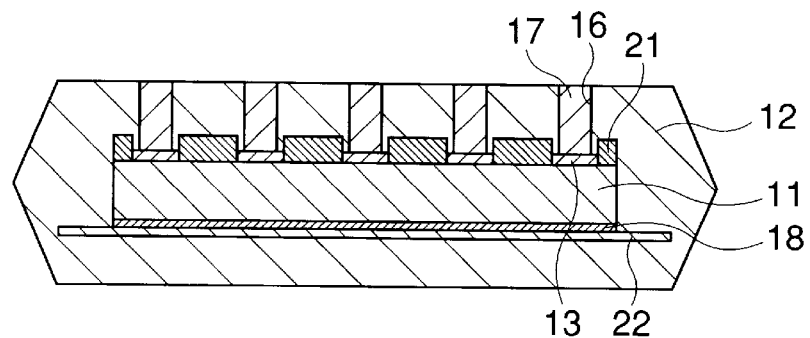
FIG. 4 is a schematic sectional view showing a conventional semiconductor package.
Figure 5A:
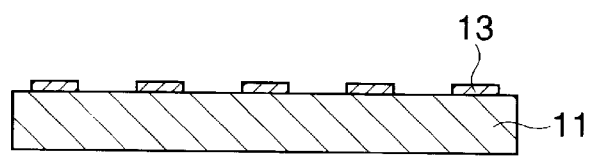
FIGS. 5A to 5H are schematic sectional views for explaining steps in manufacturing the conventional semiconductor package.
Figure 5B:
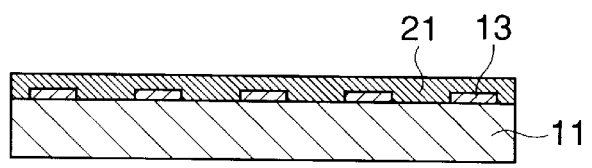
Figure 5C:
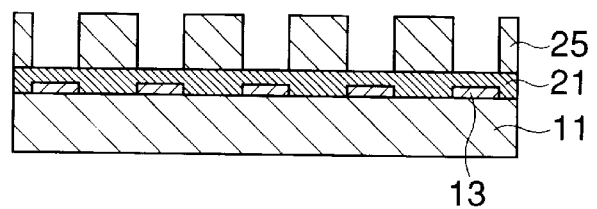
Figure 5D:
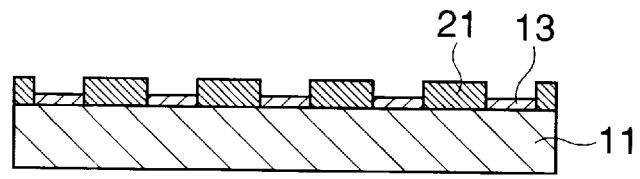
Figure 5E:
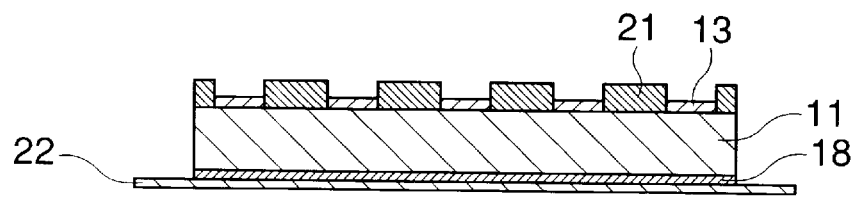
Figure 5F:
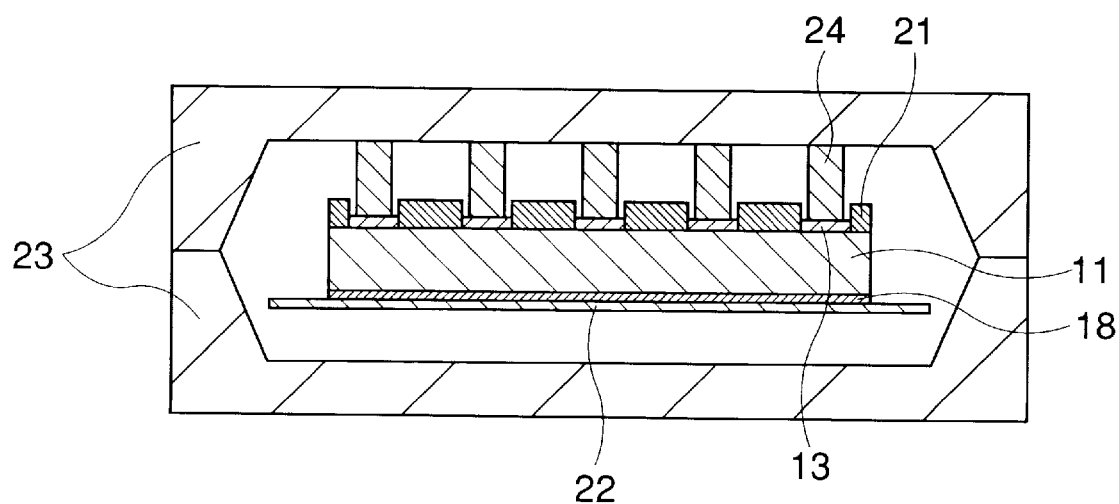
Figure 5G:
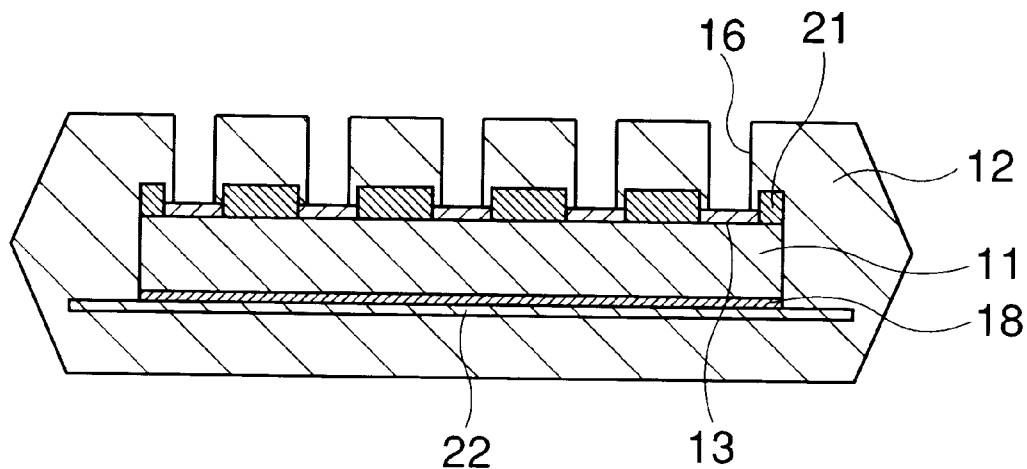
Figure 5H:
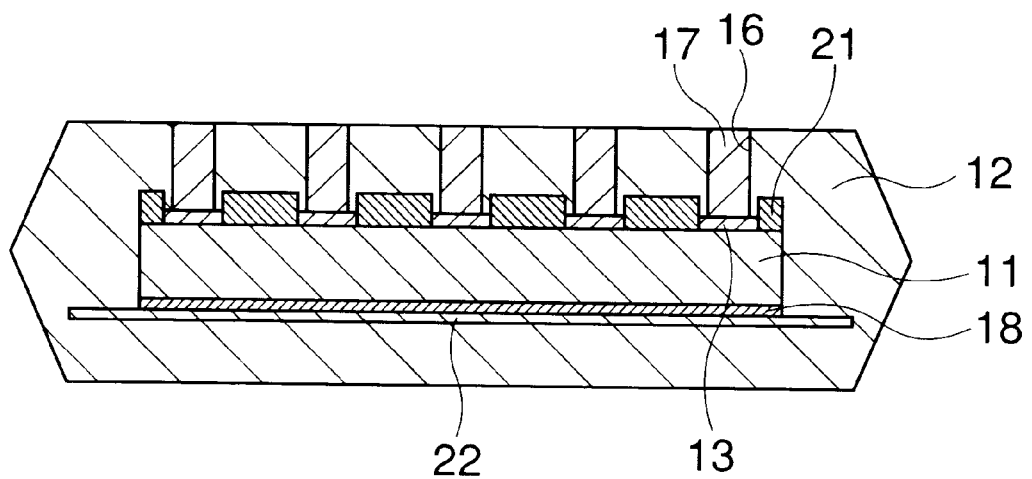

First, as shown in FIG. 2A, chip electrodes 3 are formed on the upper surface of a semiconductor chip 2. The chip electrode 3 may be a conventional wire bonding pad or a part formed by stacking aluminum on the conventional bonding pads and patterning the aluminum so as to protrude the aluminum from the surface of the semiconductor chip 2.

Figure 2B:
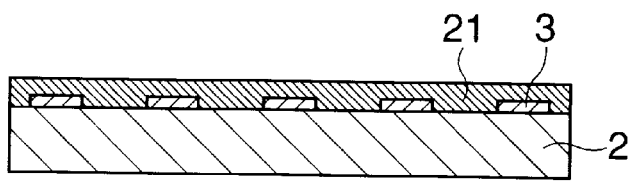

Subsequently, as shown in FIG. 2B, a protective film 21 is formed on the surface, on which the chip electrodes 3 are formed, of the semiconductor chip 2 to prevent α-rays from entering the semiconductor chip 2 from the outside.

Figure 2C:
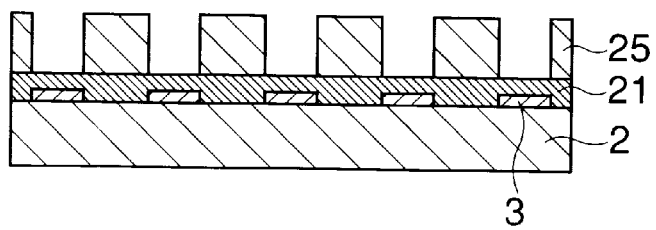

In FIG. 2C, a resist 25 is applied to the upper surface of the protective film 21 and patterned by normal photolithography.

Figure 2D:
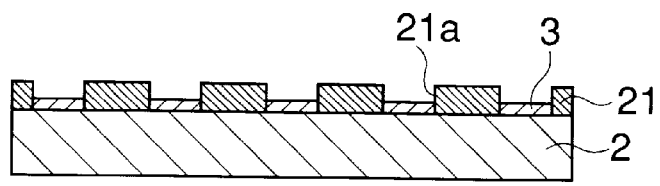

In FIG. 2D, the protective film 21 over the chip electrodes 3 is removed by anisotropic etching to form openings 21a.

Figure 2E:
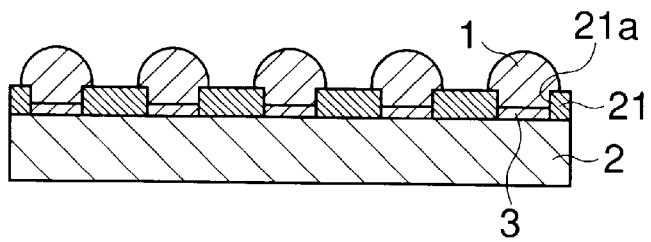

Subsequently, as shown in FIG. 2E, solder balls 1 about 120 μm in diameter are placed on the chip electrodes 3 exposed in the openings 21a of the protective film 21 and bonded to the chip electrodes 3. The following method can be used as a method of forming, placing, and bonding the solder balls.

To form the solder balls 1, a solder wire is cut in a predetermined length, and the cut wires are allowed to freely fall. A high frequency furnace is provided in the path of this free fall, and the solder is melted by a high frequency when passing through this high frequency furnace. Thereafter, the solder is cooled in the process of subsequent fall to assume a spherical shape by its own surface tension, thereby completing the solder ball 1. This method can form balls as small as about 10 μm in diameter and thus allows wiring by using balls much smaller than balls formed by a wire bonding method. Consequently, the area of the external connecting terminals in the semiconductor chip 2 can be reduced. Therefore, this method is effective when elements are miniaturized.

Note that the solder balls 1 as described above are used in this embodiment, but the present invention is not limited to this embodiment. For example, gold balls or aluminum balls may be used instead of the solder balls 1. Gold balls or aluminum balls can be formed by a method substantially the same as the method of forming the solder balls 1 and have a high adhesion strength as the solder balls 1.

The step shown in FIG. 2E will be described in more detail with reference to FIG. 3. First, as shown in FIG. 3, the solder balls 1 are arranged in depressions 51 of a jig 50. The depressions 51 are corresponding to the arrangement of the chip electrodes 3. The jig 50 is turned in the state that the solder balls 1 are heated to nearly the melting temperature of the solder balls 1, and the jig 50 is so positioned above the semiconductor chip 2 that the solder balls 1 are placed in the openings 21a of the protective film 21 above the chip electrodes 3. The jig 50 and the semiconductor chip 2 are heated to a predetermined temperature under a predetermined pressure. Consequently, the solder balls 1 are bonded to the chip electrodes 3. The melting temperature of the solder balls 1 is required to be higher than the temperature applied to the solder balls 1 in later molding. If the solder balls 1 are melted during molding, there is the possibility that the melted solder balls come into contact with the adjacent chip electrodes 3 and a short circuit is caused.

Also, the melting temperature of the solder balls 1 is required to be higher than the soldering temperature applied to the solder balls 1 when the complete semiconductor package is mounted on a printed board. If the solder balls 1 are melted during mounting, the solder balls 1 in the openings 21a flow onto a pattern on the printed board due to the surface tension because the area of the pattern on the printed board is larger than the area of the chip electrode 3. Consequently, it is no longer possible to maintain the electrical connection between the solder ball 1 and the chip electrode 3 in the opening 21a.

When the jig 50 and the semiconductor chip 2 are pressed against each other and heated, the chip electrode 3 and the solder ball 1 are essentially connected in the each opening 21a, thereby completing the wiring step in the semiconductor package. These solder balls 1 serve as external connecting terminals of the chip electrodes 3.

Figure 2F:
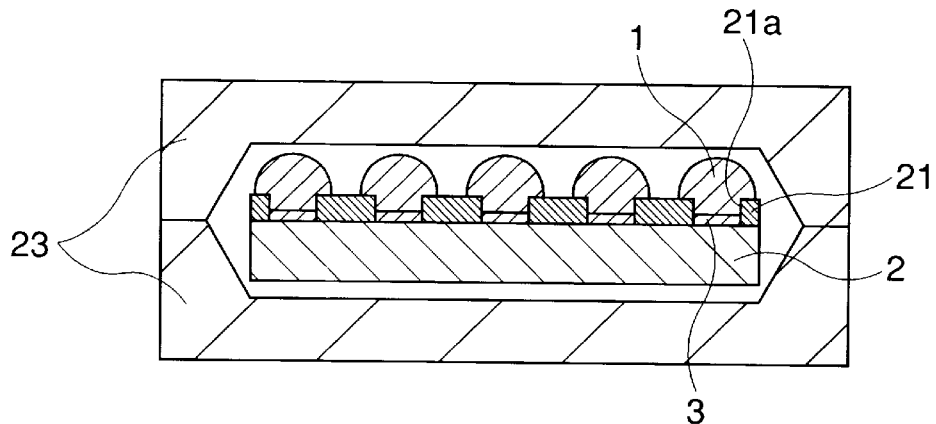

Subsequently, as shown in FIG. 2F, the semiconductor chip 2 is so located in the cavity of a mold 23 that the solder balls 1 are completely surrounded by the mold 23. Since the solder balls 1 as external connecting terminals are already connected to the semiconductor chip 2, no pins for forming connecting holes need be formed in the mold 23 in advance. Also, since it is unnecessary to run pins against the upper surfaces of the chip electrodes 3, damage to the chip electrodes 3 can be prevented.

Figure 2G:
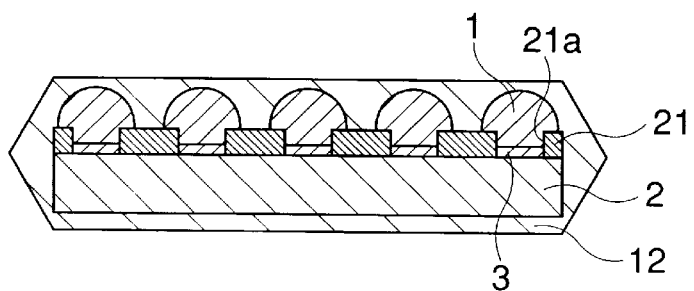

In this state, a resin is injected to fill the cavity of the mold 23. Consequently, as shown in FIG. 2G, the semiconductor chip 2 and the solder balls 1 are encapsulated with an encapsulating resin 12. This resin encapsulation is so performed that not only the semiconductor chip 2 but also the upper surfaces of the solder balls 1 are covered. Since this improves the adhesion between the encapsulating resin 12 and the solder balls 1, the removal of the solder balls 1 from the encapsulating resin 12 or the chip electrodes 3 is prevented when the surface of the encapsulating resin 12 and the upper surfaces of the solder balls 1 are later polished.

Figure 2H:
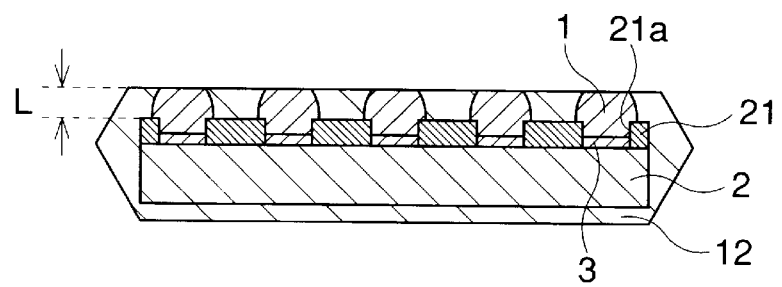

Finally, as shown in FIG. 2H, the encapsulating resin 12 on the upper surface of the semiconductor chip 2, i.e., on the surface on which the solder balls 1 are formed is polished by, e.g., a diamond wheel. This polishing is so performed that a thickness L from the upper surface of the protective film 21 to the upper surface of the package is about 100 μm. Consequently, the solder balls 1 are partially exposed from the encapsulating resin 12. In this embodiment, the thickness of the encapsulating resin 12 is set to about 100 μm. However, this thickness can be smaller than 100 μm if the necessary package strength or the material of the encapsulating resin 12 changes. The semiconductor package of the present invention is completed by the above procedure.

In this embodiment, since solder balls serving as external connecting terminals are formed in advance on chip electrodes before resin encapsulation in a resin-encapsulated semiconductor package, the formation of connecting holes becomes unnecessary and the number of manufacturing steps can be decreased. Additionally, since it is unnecessary to run pins against the chip electrodes in hole formation, damage to the chip electrodes can be prevented. Furthermore, since no fine pins need be formed in a mold, an increase in cost of the mold can be prevented and a semiconductor package can be manufactured inexpensively.

What is claimed is:

1. A method of manufacturing a resin-encapsulated semiconductor package formed by encapsulating a semiconductor chip with a resin, comprising the steps of:

(a) forming a protective film on a surface of said semiconductor chip on which a chip electrode is formed;

(b) forming an opening in said protective film to expose at least part of said chip electrode;

(c) fitting a conductive ball in the opening and connecting said conductive ball to said chip electrode;

(d) encapsulating said semiconductor chip and said conductive ball by covering all surfaces thereof with said resin; and (e) polishing a surface of said resin formed on said conductive ball to partially expose said conductive ball from the surface of said resin.

2. The method according to claim 1, wherein said conductive ball is made of a material having a melting temperature higher than a melding temperature of solder used when said semiconductor package is connected to a printed board.

3. The method according to claim 1, wherein said conductive ball is selected from the group consisting of a gold ball, an aluminum ball, and a solder ball.

4. A method of manufacturing a resin-encapsulated semiconductor package formed by encapsulating a semiconductor chip with a resin, comprising the steps of:

(a) forming a protective film on a surface of said semiconductor chip on which a chip electrode is formed;

(b) forming an opening in said protective film to expose at least part of said chip electrode;

(c) fitting a conductive member in the opening and connecting said conductive member to said chip electrode;

(d) encapsulating said semiconductor chip and said conductive member by covering all surfaces thereof with said resin; and (e) polishing a surface of said resin formed on said conductive member to partially expose said conductive member from the surface of said resin.

5. The method according to claim 4, wherein said conductive member is made of a conductive material and has the shape of a ball.

6. The method according to claim 4, further comprising the step of heating said chip electrode and said conductive member at a temperature not less than a melting point of said conductive members while pressing said conductive member against said chip electrode to connect said conductive member to said chip electrode.

7. The method according to claim 4, wherein said conductive member is made of a material having a melting temperature higher than a melding temperature of solder used when said semiconductor package is connected to a printed board.

8. The method according to claim 4, wherein said conductive member is made of a material selected from the group consisting of gold, aluminum, and solder.

\* \* \* \* \*